(12) United States Patent
Zaremba et al.

(10) Patent No.: US 6,706,236 B2
(45) Date of Patent: Mar. 16, 2004

(54) METHOD FOR MAKING HOLES IN CERAMIC GREEN SHEETS

(75) Inventors: Juergen Zaremba, Rottenburg (DE); Walter Zein, Metzingen (DE); Wolfgang Jacob, Horb (DE); Ralf Schmid, Kaltental (DE)

(73) Assignee: Robert Bosch GmbH, Stuttgart (DE)

( * ) Notice: Subject to any disclaimer, the term of this patent is extended or adjusted under 35 U.S.C. 154(b) by 81 days.

(21) Appl. No.: 09/726,757

(22) Filed: Nov. 30, 2000

(65) Prior Publication Data

US 2002/0030306 A1 Mar. 14, 2002

(30) Foreign Application Priority Data

Nov. 30, 1999 (DE) .......................................... 199 57 517

(51) Int. Cl.$^7$ .............................. B28B 11/12; B26F 1/26
(52) U.S. Cl. ....................... 264/504; 264/154; 425/290; 425/387.1; 156/252; 156/513
(58) Field of Search .................................. 264/504, 154; 425/290, 387.1; 156/105, 382, 513, 252

(56) References Cited

U.S. PATENT DOCUMENTS

| | | | | |
|---|---|---|---|---|
| 3,742,182 A | * | 6/1973 | Saunders | 219/121.71 |
| 4,289,719 A | * | 9/1981 | McIntosh et al. | 29/830 |
| 4,425,829 A | * | 1/1984 | Kranik et al. | 83/62.1 |
| 5,043,223 A | * | 8/1991 | Kumagai et al. | 428/432 |
| 5,242,641 A | * | 9/1993 | Horner et al. | 264/104 |
| 5,759,331 A | * | 6/1998 | Wallace | 156/248 |
| 6,463,831 B1 | * | 10/2002 | DiMaria | 76/107.1 |

FOREIGN PATENT DOCUMENTS

| | | | | |
|---|---|---|---|---|
| EP | 1036637 A1 | * | 9/2000 | B26F/1/02 |
| JP | 06-218717 A | * | 8/1994 | B28B/11/12 |
| JP | 11 58297 A | | 3/1999 | |
| JP | 2001-009790 A | * | 1/2001 | B26F/1/02 |

OTHER PUBLICATIONS

Machine Translation of JP–06–218717–A, Japanese Patent Office website, Nov. 2002.*

Pearson, E.S., "Gang Punch for Soft Workpieces", Sep. 1976, IBM Techinical Disclosure Bulletin, vol. No. 19, Issue No. 4, pp. 1272 and 1273.*

* cited by examiner

Primary Examiner—Michael Colaianni
Assistant Examiner—Michael I. Poe
(74) Attorney, Agent, or Firm—Kenyon & Kenyon

(57) ABSTRACT

To make holes in ceramic green sheets that are needed to create feedthroughs, it is proposed to make the holes by using a gas that is under a higher pressure than atmospheric pressure and that is expelled in a pulsed manner from a pressure vessel and thereby acts on a principal surface of a ceramic green sheet, at at least one location at which a hole is to be made, in such a way that material is shot out of the ceramic green sheet at that location. This eliminates the disadvantages associated with the use of punches to punch holes.

10 Claims, 1 Drawing Sheet

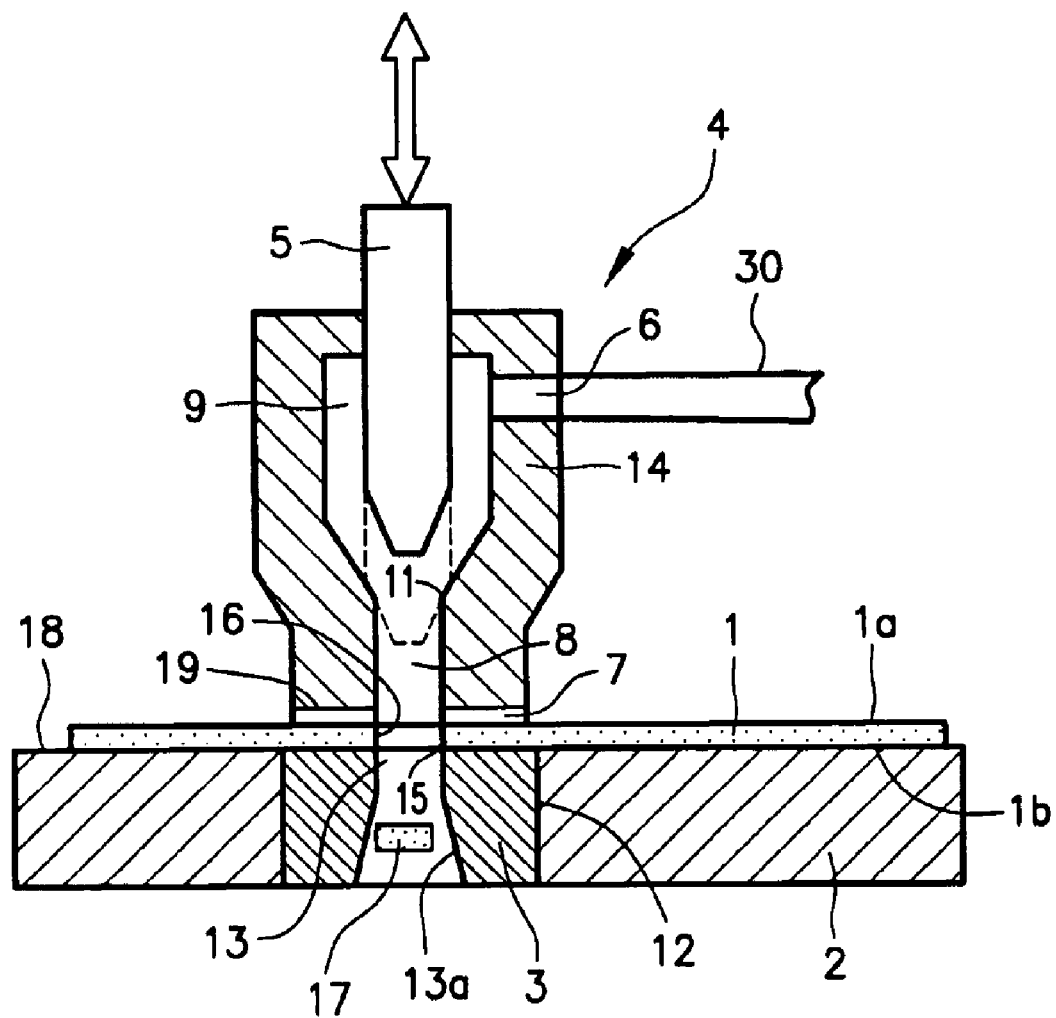

US 6,706,236 B2

METHOD FOR MAKING HOLES IN CERAMIC GREEN SHEETS

FIELD OF THE INVENTION

The present invention relates to a method for making holes in ceramic green sheets and to a device for carrying out the method.

BACKGROUND INFORMATION

Multilayer ceramic substrates, such as LTCC (low-temperature cofired ceramic) substrates, are known to be made from a stack of "ceramic green sheets." The term "ceramic green sheets" denotes unfired ceramic sheets in the raw state, which are pliable and ductile within set limits. Before being stacked, the ceramic green sheets are provided with holes and are then printed with conductor paste by the screen printing process to produce conductive lands. The conductor paste at the same time makes its way into the holes, thereby producing electrical feedthroughs known as vias, which later will interconnect the various circuit layers of the finished multilayer substrate. Once printed, the ceramic sheets are dried, stacked, laminated and fired.

The holes in the ceramic green sheets are usually made by punching. Such a method is known, for example, from Japanese Laid Open Patent Application No. 11058297. For this purpose, the ceramic green sheet to be processed is laid on a support plate provided with apertures. A punch is then used in the conventional manner to punch holes in the ceramic green sheet at the prescribed locations. The punch is made of tungsten, for example. The material punched out at the hole locations is conveyed as chads from the tool tip of the punch through the apertures in the support plate into a receiving space, where it is blown away from the tip of the punch by compressed air. A disadvantage of the known method is that the punches are subjected to high mechanical stresses and thus wear out quickly. This disadvantage is exacerbated by the fact that often very small holes with a circular diameter of, for example, 0.5 mm are punched in the ceramic green sheet. Breakage of punches during such operations is not uncommon. A further disadvantage results from the fact that despite removal of the punchings by compressed air, which requires substantial outlay, it is not always possible to ensure that the portion of the punch tip acting on the ceramic sheets is free of chads. These often adhere to the tip and are difficult to remove. As a result, there is always the possibility of damage to the ceramic sheet and deviation of the shape of the holes from what is intended.

SUMMARY OF THE INVENTION

The method according to the present invention avoids the known disadvantages of the related art. The fact that a punch is no longer used to make the holes saves the set-up time and cost involved in replacing a damaged punch. According to the present invention, the holes are made by using a gas placed under a higher pressure than atmospheric pressure, which is expelled in a pulsed manner from a pressure vessel and thereby acts on the ceramic green sheet, at at least one location where a hole is to be made, in such a way that the expelled gas shoots material out of the ceramic green sheet at that location. Material fatigue and wear phenomena of the kind that occur with the use of a punch can be avoided in this way. There is no possibility of damage to the ceramic green sheets and the support plate due to breakage of a punch. In addition, it is particularly advantageous that there is no need for the lateral blowing-off and cleaning of the punch tip. For the reasons cited, the cost of producing multilayer ceramic substrates can be greatly reduced.

BRIEF DESCRIPTION OF THE DRAWING

The FIGURE is a schematic representation of a device for making holes in ceramic green sheets.

DETAILED DESCRIPTION

The FIGURE shows a device for making holes in ceramic green sheets. Ceramic green sheets are unfired ceramic sheets made of a sinterable glass-ceramic material. The unfired sheets are ductile and pliable within set limits, but very quickly break or crack under high mechanical stresses of the kind that occur during folding, for example. It is generally known in LTCC production to make holes in ceramic green sheets and then, in the screen-printing process, to print conductive lands on the ceramic sheets by using conductor paste, which is also placed in the holes. The holes are ordinarily circular in cross section, but other cross sections can also theoretically be contemplated. In this way, the ceramic green sheets are provided with feedthroughs or vias that are designed to interconnect electrically the various levels of conductive lands in the finished multilayer substrate. The ceramic sheets provided with conductive lands and vias are then stacked, laminated and fired in a sintering furnace. This is preferably done in automated line production. The precision of the holes made in the ceramic sheets is very important, since improper alignment of the feedthroughs during stacking can result in inadequate electrical contact between the levels of conductive lands.

The procedure for making the holes is as follows. First, a ceramic green sheet 1 is conveyed to a processing station, where it arrives with its lower principal surface 1b resting on the upper side 18 of a support plate 2. This can advantageously be performed by an automatic transport arrangement in line production. The ceramic green sheet 1 can be aligned on the support plate in a known manner to effect registration. At a plurality of locations, the support plate 2 has cut-outs 12 into which cutting bushings 3 are inserted. For purposes of simplification, only one of these bushings is shown in the FIGURE. The cutting bushing 3 and the support plate 2 are preferably made of metal. The upper end of cutting bushing 3 terminates flush with the upper side of support plate 2. Each cutting bushing 3 has a throughpassing aperture 13, the inner wall 13a of aperture 13 forming with the upper side 18 of support plate 2 a circumferential, circular, sharp cutting edge 15 whose diameter corresponds to the diameter of the hole to be made in the ceramic green sheet 1 at that location. The processing station further includes a pressure vessel filled with gas that is under a higher pressure than atmospheric pressure. In the exemplary embodiment shown here, the pressure vessel has at least one high-pressure valve 4, which has an inlet 6 that is connected to a high-pressure line 30. The other end of the high-pressure line can be connected to a compressor or a compressed-air cylinder, for example. High-pressure valve 4 is movable and can be moved, by a controller, for example, to a location on the ceramic green sheet at which the hole is to be made, and there lowered onto the principal surface 1a of the ceramic sheet facing away from support plate 2. As shown in the Figure, inlet 6 opens into a pressure chamber 9 having an outlet passage 8. Outlet passage 8 extends vertically downward and has at its bottom end a circular opening that is surrounded by an annular surface 19 oriented parallel to ceramic green sheet 1. An annular seal 7 is provided on annular surface 19. When high-pressure valve 4 is lowered, annular seal 7 comes to bear against principal surface 1a of ceramic sheet 1. In addition, an axially movable valve member 5 is provided in pressure chamber 9. When high-pressure valve 4 is closed, valve member 5 bears against a valve seat 11, thereby sealing outlet passage 8. If valve member 5 is moved upwardly in the direction of the arrow, then the pressurized gas contained in pressure chamber 9 is expelled through outlet passage 8. The subsequent lowering of valve member 5 recloses outlet passage 8. In this way, gas is expelled in a pulsed manner from outlet passage 8. The gas used can be air, for example.

As is readily apparent from the FIGURE, the pressure pulse of the gas expelled from outlet passage 8 acts on principal surface 1a of ceramic sheet 1 in such a way that a disk-shaped slug 17 is shot out of the ceramic sheet and a hole 16 is produced. Slug 17 removed from ceramic sheet 1 passes outward through aperture 13 in support plate 2 and can be collected below support plate 2. The diameter of the aperture in the cutting bushing increases toward the bottom, so that the slug 17 of material can easily be blown out of the bottom opening in the cutting bushing. The cutting bushings thus cannot become clogged and are again available for making holes. Cutting edge 15 determines the shape and size of hole 16. Although the holes are ordinarily circular, holes of any other desired shape can, of course, be made. Another cutting bushing with a differently shaped cutting edge 15 need only be used in such a case. Advantageously, the cutting bushings 3 can be replaced in support plate 2 if they become worn or damaged or if the shape or diameter of the holes is to be changed. After the holes 16 have been made, high-pressure valve 4 is raised again and moved to another location on ceramic green sheet 1 where a hole is to be made. The cutting bushing present at that location can have an aperture 13 of the same or a different diameter.

In the exemplary embodiment shown here, the diameter of outlet passage 8 and seal 19 is adapted to the diameter of cutting edge 15 of cutting bushing 3. However, it is also possible to use high-pressure valves 4 in which the diameter of outlet passage 8 is greater than the diameter of cutting edge 15. Furthermore, it is also possible to omit seal 19. Since ceramic green sheets 1 are fragile and brittle, hole 16 can be made even if gas is able to escape through a gap between surface 19 and principal surface 1a of the ceramic green sheet. The pulsed expulsion of the pressurized gas is still able to shoot slug 17 out of ceramic sheet 1.

In the exemplary embodiment shown here, a support plate 2 is used that has one cutting bushing 3, provided with an aperture 13, for each location at which holes 16 are to be made. High-pressure valve 4 is conveyed to the locations at which holes are to be made. It is also possible, however, to implement the high-pressure valve as stationary and instead to convey the support plate 2 with the ceramic sheet 1 arranged thereon. Further, it is also conceivable to move only the ceramic sheet 1 on the support plate, so that one and the same cutting bushing can be used to make a plurality of holes. Further, it is also possible to advance the ceramic green sheet through a plurality of processing stations, each of which has a support plate with a different arrangement of cutting bushings. It is also, of course, possible to make the apertures 13 directly in the support plate 2, omitting the cutting bushings. In this case, for example, a support plate with a matrix-like arrangement of apertures 13 can be used. Depending on the requirements of the case, specific ones of the apertures 13 can be driven by high-pressure valve 4. If the holes in the next ceramic sheet are to be made at other locations, then other apertures 13 in the support plate are driven by high-pressure valve 4. Further, it is also possible to provide in one high-pressure valve a plurality of outlet passages 8 all of which are opened and closed simultaneously with the aid of a valve slide plate, or to use a plurality of high-pressure valves simultaneously at one processing station. It is also conceivable simultaneously to deliver a plurality of ceramic green sheets to one processing station and provide them with holes.

To summarize, the making of holes in ceramic green sheets by using a gas expelled in a pulsed manner at one or more processing stations can be implemented in a very flexible manner to meet the above-described requirements.

What is claimed is:

1. A method of making a hole in a ceramic green sheet supported on a support, comprising the steps of:

positioning a gas processing station such that a contact between the gas processing station and a principal surface of the ceramic green sheet occurs, the principal surface being the surface of the ceramic green sheet facing away from the support;

forming the hole by causing a gas that is under a higher pressure than atmospheric pressure to be expelled in a pulsed manner from a pressure vessel of the gas processing station in order to act on the principal surface of the ceramic green sheet at at least one location where the hole is to be located, wherein:

a material is shot out of the ceramic green sheet at the at least one location.

2. The method according to claim 1 further comprising:

providing a support plate as the support for supporting the ceramic green sheet, the support plate being provided with an aperture at the at least one location, the aperture including a diameter corresponding to a diameter of the hole to be made in the ceramic green sheet at the at least one location.

3. The method according to claim 2, wherein:

inner walls of the aperture in the support plate and a supporting surface of the support plate facing the ceramic green sheet form a circumferential cutting edge having a diameter corresponding to the diameter of the hole.

4. The method according to claim 2, further comprising:

arranging the aperture in a cutting bushing secured in a cut-out in the support plate.

5. The method according to claim 4, further comprising:

arranging an end of the cutting bushing facing the ceramic green sheet flush with a supporting surface of the support plate.

6. The method according to claim 2, wherein the forming of the hole includes:

providing at least one high-pressure valve that includes a valve body, connecting an inlet of the valve body to a high-pressure line, the inlet opening into a pressure chamber filled with the gas that is pressurized with respect to atmospheric pressure, arranging a movable valve member of the at least one high-pressure valve in the pressure chamber, and providing at least one outlet passage of the at least one high-pressure valve that is connected to the pressure chamber and that is capable of being closed and opened in accordance with the movable valve member.

7. The method according to claim 6, further comprising:
causing a relative movement between the at least one high-pressure valve and the support plate provided with the ceramic green sheet in order to move the at least one high-pressure valve to a position at which the hole is to be made in the ceramic green sheet.

8. The method according to claim 7, further comprising:
lowering the at least one high-pressure valve onto the ceramic green sheet in such a way that an outer end of the at least one outlet passage is capable of being placed on a side of the ceramic green sheet facing away from the support plate.

9. The method according to claim 8, further comprising:
providing a surface element extending parallel to the ceramic green sheet; and
surrounding the outer end of the at least one outlet passage by the surface element.

10. The method according to claim 9, further comprising:
arranging a circumferential seal on the surface element.

* * * * *